(12) United States Patent
Nam et al.

(10) Patent No.: US 6,930,008 B2
(45) Date of Patent: Aug. 16, 2005

(54) METHOD OF FABRICATING A COMPLEMENTARY BIPOLAR JUNCTION TRANSISTOR

(75) Inventors: Dong-kyun Nam, Seongnam-si (KR); Sung-ryoul Bae, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/025,054

(22) Filed: Dec. 30, 2004

(65) Prior Publication Data

US 2005/0148135 A1  Jul. 7, 2005

(30) Foreign Application Priority Data

Jan. 2, 2004  (KR) ............... 10-2004-0000053

(51) Int. Cl.[7] ........................................ H01L 21/8228
(52) U.S. Cl. ...................... 438/322; 438/340
(58) Field of Search ................ 438/322, 340

(56) References Cited

U.S. PATENT DOCUMENTS 5,204,274 A * 4/1993 Kanda et al. ............... 438/322
5,629,219 A * 5/1997 Miwa ......................... 438/322
5,712,174 A * 1/1998 Hirai et al. .................. 438/234
5,807,780 A * 9/1998 Davis et al. ................. 438/311
5,885,880 A * 3/1999 Gomi .......................... 438/322

FOREIGN PATENT DOCUMENTS

| JP | 2003152094 | 5/2003 |
|---|---|---|
| KR | 1998-070685 | 10/1998 |
| KR | 1020020086450 | 8/2002 |

\* cited by examiner

Primary Examiner—Trung Dang
(74) Attorney, Agent, or Firm—Lee & Morse, P.C.

(57) ABSTRACT

A method of fabricating a complementary bipolar junction transistor includes forming a polycrystalline silicon layer on an NPN bipolar junction transistor region and a PNP bipolar junction transistor region, respectively implanting an N-type impurity and a P-type impurity into the polycrystalline silicon layer, and then diffusing to respectively form an N-type emitter region and a P-type emitter region within a P-type base region and an N-type base region. By patterning the polycrystalline silicon layer, an N-type emitter electrode and a P-type emitter electrode are simultaneously formed. The polycrystalline silicon layer is used for simultaneously forming the N-type emitter electrode of the NPN bipolar junction transistor and the P-type emitter electrode of the PNP bipolar junction transistor by a single depositing and etching process.

10 Claims, 7 Drawing Sheets

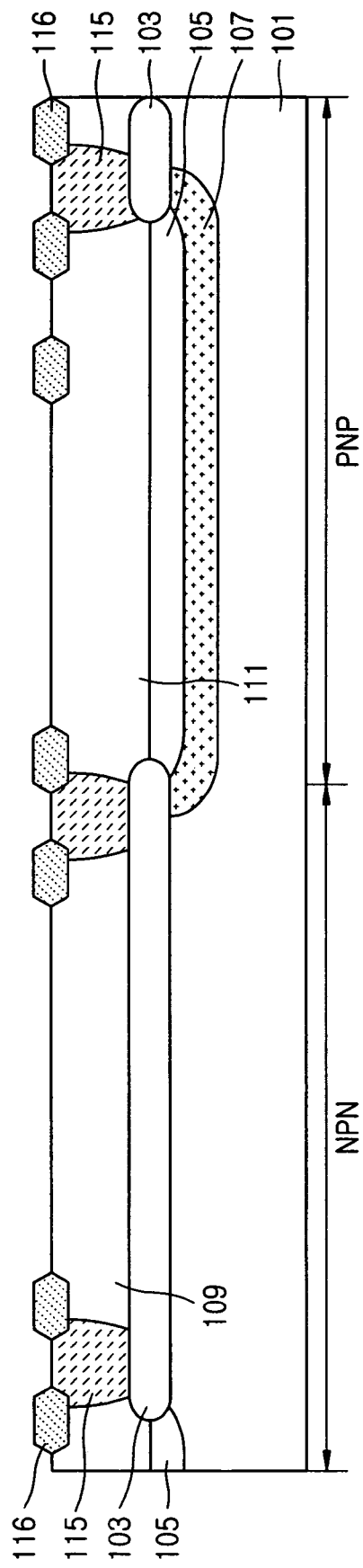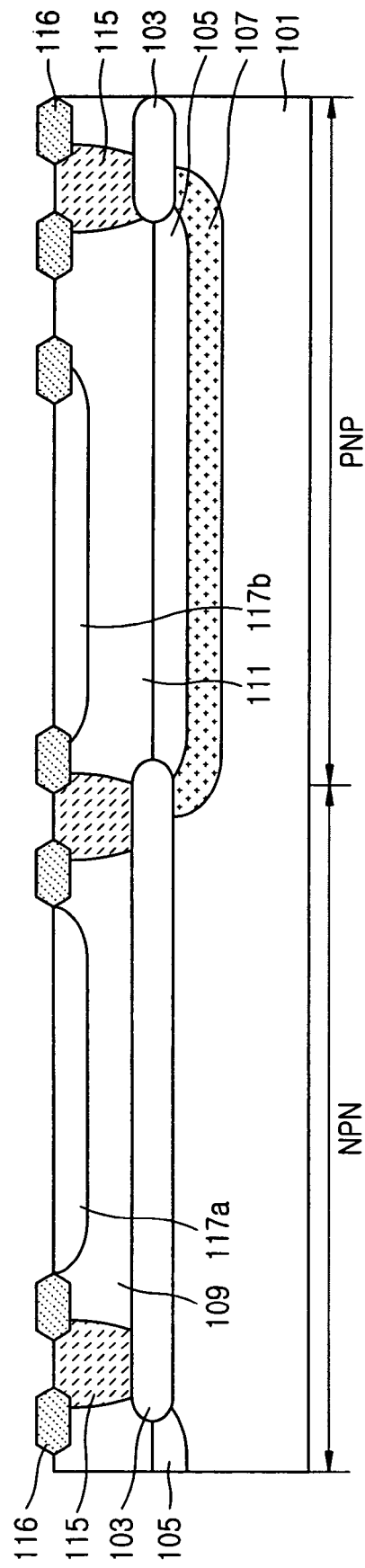

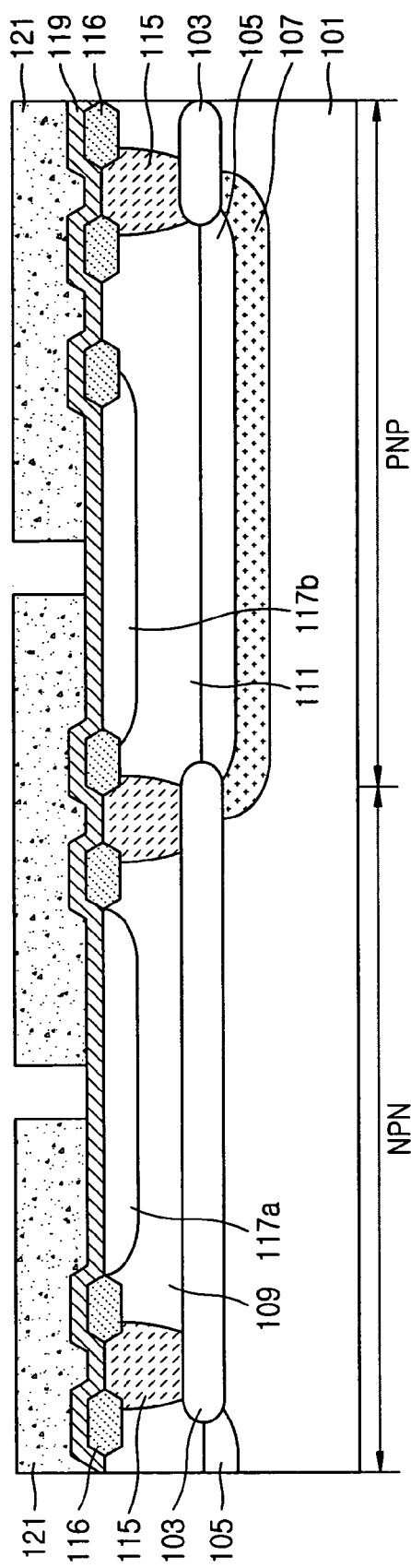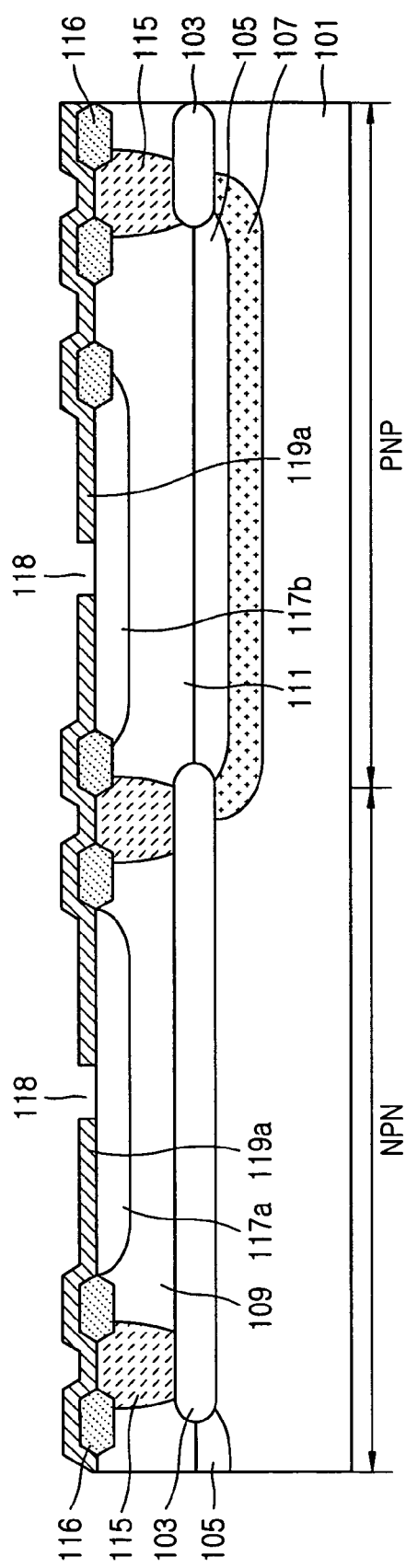

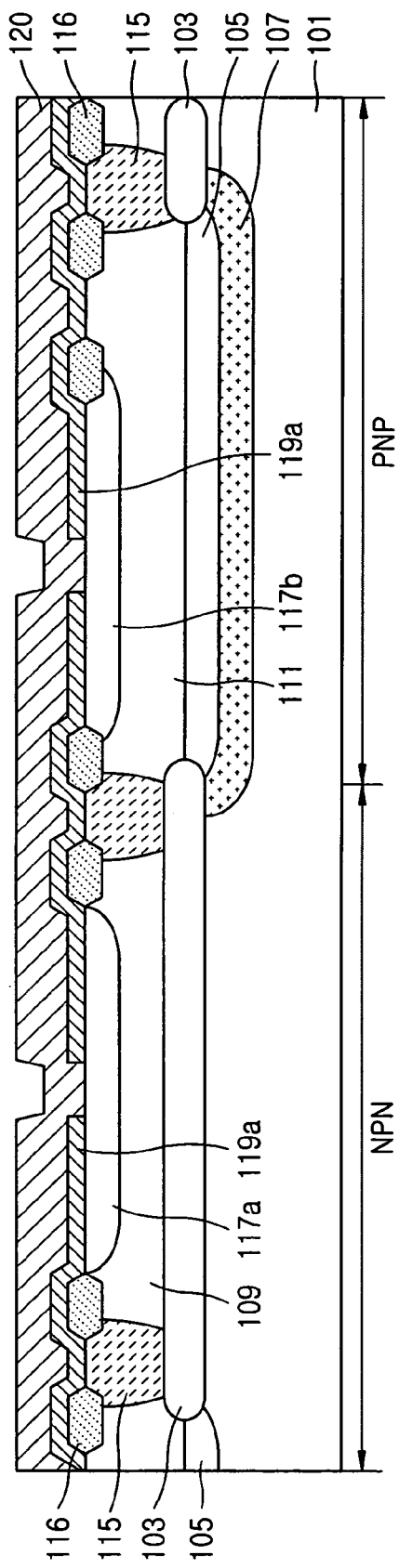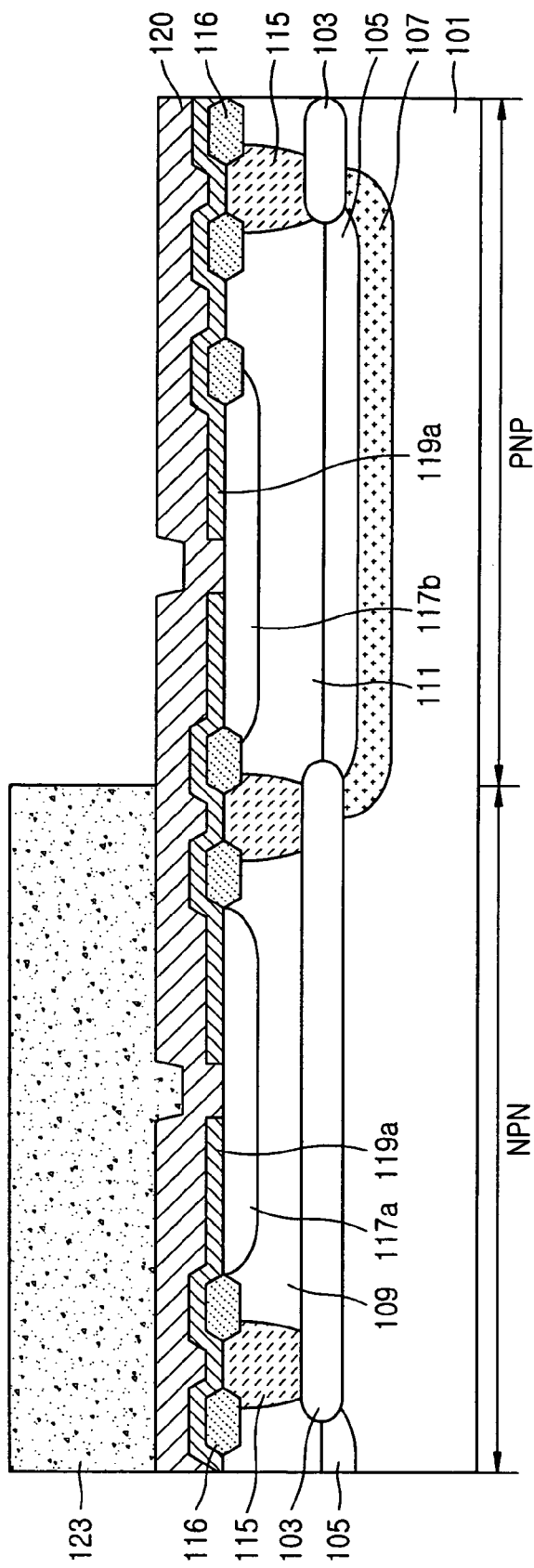
FIG. 7
FIG. 8

METHOD OF FABRICATING A COMPLEMENTARY BIPOLAR JUNCTION TRANSISTOR

BACKGROUND OF THE INVENTION

1. Field of the Invention

The present invention relates to a method of fabricating a bipolar junction transistor. More particularly, the present invention relates to a method of fabricating a complementary bipolar junction transistor.

2. Description of the Related Art

Bipolar junction transistors with higher current driving capacity and faster operating speed have been increasingly replacing MOS field effect transistors in specific parts of individual products in recent years. Also, a complementary bipolar transistor in which a PNP bipolar junction transistor and an NPN bipolar junction transistor are integrated on a silicon substrate is being employed for realizing high-speed data processing and high performance.

In a conventional complementary bipolar junction transistor, a P-type emitter electrode of a PNP bipolar junction transistor and an N-type emitter electrode of an NPN bipolar junction transistor are separately formed. In more detail, after the N-type emitter electrode of the NPN bipolar junction transistor is formed on a first portion of a silicon substrate, the P-type emitter electrode of the PNP bipolar junction transistor is formed on a second portion of the silicon substrate. The separately-formed N-type emitter electrode of the NPN bipolar junction transistor and the P-type emitter electrode of the PNP bipolar junction transistor complicate a fabricating process and impede precise fabricating of the complimentary bipolar junction transistor.

SUMMARY OF THE INVENTION

The present invention is therefore directed to a method of fabricating a complementary bipolar junction transistor, which substantially overcomes one or more of the problems due to the limitations and disadvantages of the related art.

It is a feature of an embodiment of the present invention to provide a method of fabricating a complementary bipolar junction transistor that simultaneously forms a P-type emitter electrode of a PNP bipolar junction transistor and an N-type emitter electrode of an NPN bipolar junction transistor.

It is another feature of an embodiment of the present invention to provide a method of fabricating a complementary bipolar junction transistor that forms a P-type emitter electrode of a PNP bipolar junction transistor and an N-type emitter electrode of an NPN bipolar junction transistor in a single deposit and etch process.

It is yet another feature of an embodiment of the present invention to provide a method of fabricating a complementary bipolar junction transistor in which a P-type emitter region of a vertical PNP bipolar junction transistor is formed as a shallow junction.

At least one of the above and other features and advantages of the present invention according to an aspect of the present invention may be realized by providing a method of fabricating a complementary bipolar junction transistor including, providing a substrate having a P-type base region and an N-type base region on active regions of a PNP bipolar junction transistor region and an NPN bipolar junction transistor region, forming a first polycrystalline silicon layer pattern having contact holes that partially expose surfaces of the P-type base region and the N-type base region, forming a second polycrystalline silicon layer on an entire surface of the silicon substrate having the first polycrystalline silicon layer pattern, the second polycrystalline silicon layer filling the contact holes, respectively forming an N-type emitter region and a P-type emitter region within the P-type base region and the N-type base region by implanting and diffusing an N-type impurity and a P-type impurity respectively into the second polycrystalline silicon layer of the NPN bipolar junction transistor region and the PNP bipolar junction transistor region, and simultaneously forming an N-type emitter electrode and a P-type emitter electrode by patterning the second polycrystalline silicon layer and the first polycrystalline silicon layer.

Forming the first polycrystalline silicon layer pattern may include forming a first polycrystalline silicon layer on an entire surface of the silicon substrate having the P-type base region and the N-type base region, forming a photoresist pattern that partially exposes an upper portion of the first polycrystalline silicon layer disposed on upper portions of the P-type base region and the N-type base region, and etching the first polycrystalline silicon layer using the photoresist pattern as an etch mask.

While etching the second polycrystalline silicon layer, the first polycrystalline silicon layer pattern may be simultaneously etched, thereby exposing surfaces of each of the P-type base region, the N-type collector region, the N-type base region, and the P-type collector region. The second polycrystalline silicon layer of the PNP bipolar junction transistor region may be implanted by implanting boron (B) at a dose of about $5\ E15/cm^2$ to about $1\ E16/cm^2$ with an energy of about 40 KeV to about 80 KeV. The second polycrystalline silicon layer of the NPN bipolar junction transistor region may be implanted by implanting one of arsenic (As) and phosphor (P) at a dose of about $9\ E15/cm^2$ to about $1\ E16/cm^2$ with an energy of about 40 KeV to 80 KeV.

Providing the substrate having the P-type base region and the N-type base region on active regions of a PNP bipolar junction transistor region and an NPN bipolar junction transistor region may include respectively forming an N-type buried layer and a P-type buried layer on the NPN bipolar junction transistor region and the PNP bipolar junction transistor region of the substrate, forming an N-type epitaxial layer on an entire surface of the silicon substrate having the N-type buried layer and the P-type buried layer, forming a P-type collector region in the N-type epitaxial layer of the PNP bipolar junction transistor region, forming an N-type collector region, which is electrically connected to the N-type buried layer, on the N-type epitaxial layer of the NPN bipolar junction transistor region, defining an active region by forming field regions of the N-type epitaxial layer, the N-type collector region and the P-type collector region, respectively forming the P-type base region and the N-type base region on the active regions of the PNP bipolar junction transistor region and the NPN bipolar junction transistor region.

The method may include forming an N-type vertical buried layer in a lower portion of the P-type buried layer of the PNP bipolar junction transistor region to encircle the P-type buried layer. A junction depth of the N-type emitter region of the NPN bipolar junction transistor region and the P-type emitter region of the PNP bipolar junction transistor region may be about 0.1 μm to about 0.2 μm.

Forming the N-type emitter region and the P-type emitter region may include implanting an N-type impurity and a P-type impurity respectively into the second polycrystalline silicon layer of the NPN bipolar junction transistor region and the PNP bipolar junction transistor region, and simultaneously forming the N-type emitter region and the P-type emitter region using annealing to diffuse the N-type impurity and the P-type impurity included in the second polycrystalline silicon layer into the silicon substrate through the contact holes. The annealing the N-type impurity and the P-type impurity may be performed at a temperature of about 900° C. to about 1100° C.

In the present invention as described above, the polycrystalline silicon layer is used for simultaneously forming the N-type emitter electrode of the NPN bipolar junction transistor and the P-type emitter electrode of the PNP bipolar junction transistor using a single depositing and etching process.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 1 through 11 illustrate cross-sectional views of stages in a method of fabricating a complementary bipolar junction transistor according to the present invention.

DETAILED DESCRIPTION OF THE INVENTION

Figure 1:
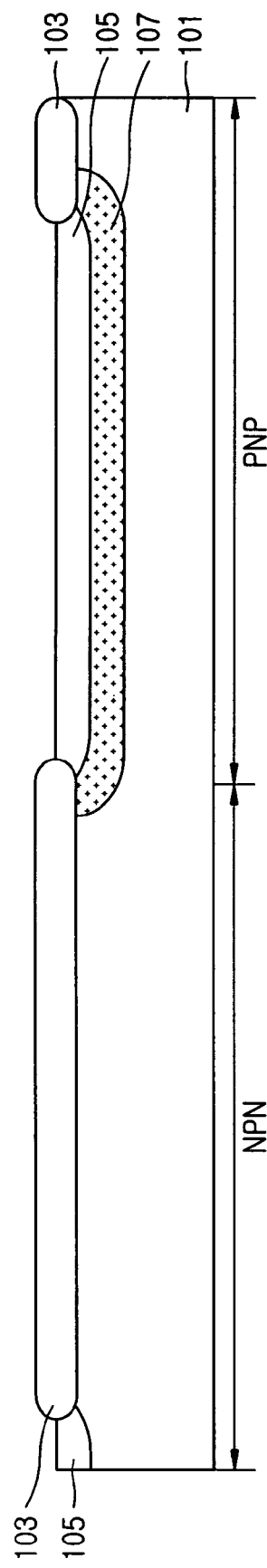

Korean Patent Application No. 2004-53, filed on Jan. 2, 2004, in the Korean Intellectual Property Office, and entitled: "Method of Fabricating Complementary Bipolar Junction Transistor," is incorporated by reference herein in its entirety.

The present invention will now be described more fully with reference to the accompanying drawings. The invention may, however, be embodied in many different forms and should not be construed as being limited to the embodiments set forth herein; rather these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIGS. 1 through 11 illustrate cross-sectional views of stages of a method of fabricating a complementary bipolar junction transistor according to the present invention.

Referring to FIG. 1, an N-type buried layer 103 and a P-type buried layer 105 are formed in a silicon substrate 101 on which an NPN bipolar junction transistor region and a PNP bipolar junction transistor regions are defined. That is, the N-type buried layer 103 and the P-type buried layer 105 are respectively formed in a first portion NPN and a second portion PNP of the silicon substrate 101. The first portion NPN is the NPN bipolar junction transistor region, and the second portion PNP is the PNP bipolar junction transistor region.

The N-type buried layer 103 may be formed by ion implanting an N-type impurity into the first portion NPN of the silicon substrate 101, which is then activated by annealing. For example, the N-type buried layer 103 may be formed by ion implanting the N-type impurity, e.g., arsenic (As) or phosphor (P), at a dose of about $1 \, \text{E}15/\text{cm}^2$ to about $6 \, \text{E}15/\text{cm}^2$ with an energy of about 30 KeV to about 40 KeV, which is then activated by annealing.

The P-type buried layer 105 may be formed by ion implanting a P-type impurity into the second portion PNP, which is then activated by annealing. For example, the P-type buried layer 105 may be formed by ion implanting the P-type impurity, e.g., Boron (B), at a dose of about $5 \, \text{E}13/\text{cm}^2$ to about $1 \, \text{E}14/\text{cm}^2$ with an energy of about 40 KeV to about 100 KeV, which is then activated by annealing.

An N-type vertical buried layer 107 is formed under the P-type buried layer 105 of the PNP bipolar junction transistor region to encircle the P-type buried layer 105. The N-type vertical buried layer 107 is formed for electrical isolation with the NPN bipolar junction transistor.

Figure 2:
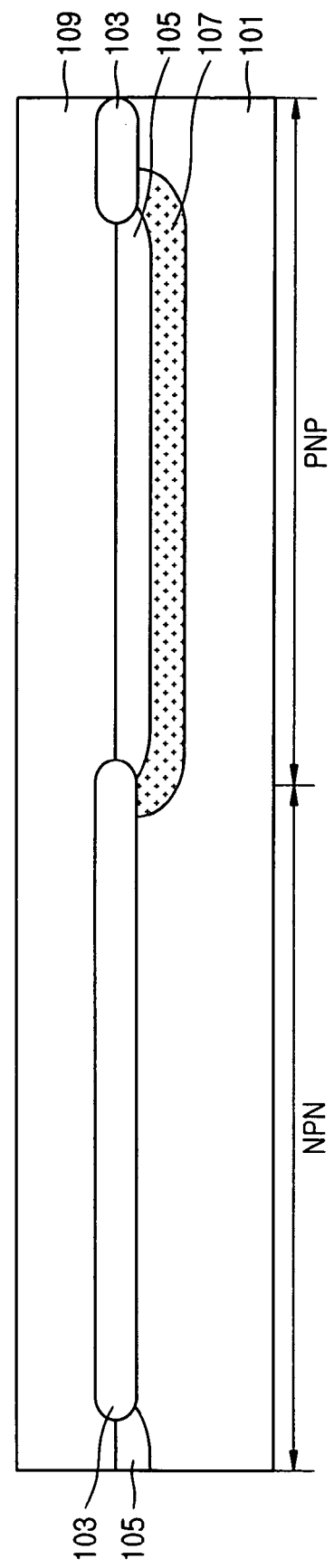

Referring to FIG. 2, an N-type epitaxial layer 109 may be formed via epitaxy on the entire surface of the silicon substrate 101 having the N-type buried layer 103 and the P-type buried layer 105. The N-type epitaxial layer 109 may be formed to a thickness of about 1.7 $\mu$m to about 3 $\mu$m. The N-type epitaxial layer 109 may serve as active regions of the PNP bipolar junction transistor and the NPN bipolar junction transistor.

Referring to FIG. 3, the P-type impurity is implanted into the N-type epitaxial layer 109 of the PNP bipolar junction transistor region, thereby forming a P-type collector region 111 in the form of a well.

Then, an N-type collector region 115, electrically connected to the N-type buried layer 103, is formed in the N-type epitaxial layer 109 of the NPN bipolar junction transistor region. The N-type collector region 115 may be formed by ion implanting the N-type impurity, e.g., As or P, at a dose of about $5 \, \text{E}15/\text{cm}^2$ to about $1 \, \text{E}16 \, \text{cm}^2$ with an energy of about 70 KeV to about 80 KeV. The N-type collector region 115 is also used to electrically isolate the PNP bipolar junction transistor.

Subsequently, field regions 116 are formed for defining active regions and electrode regions in the N-type epitaxial layer 109, the N-type collector region 115 and the P-type collector region 111. The field regions 116 may be formed of a field oxide layer. Portions without one of the field regions 116 serve as an active region or an electrode region. Field regions 116 are disposed on both sides of the N-type collector region 115 of the NPN bipolar junction transistor region.

Referring to FIG. 4, the P-type impurity and the N-type impurity are respectively implanted into the active regions of the PNP bipolar junction transistor region and the NPN bipolar junction transistor region, which are then activated by annealing. Thus, a P-type base region 117a and an N-type base region 117b are formed.

In other words, the PNP bipolar transistor region is formed with the P-type base region 117a by selectively implanting the P-type impurity using photolithography and then annealing. The P-type base region 117a may be formed by ion implanting the P-type impurity, e.g., B, at a dose of about $1 \, \text{E}14/\text{cm}^2$ to $3 \, \text{E}14/\text{cm}^2$ with an energy of about 70 KeV to about 80 KeV.

The NPN bipolar junction transistor region is formed with the N-type base region 117b by selectively implanting the N-type impurity using photolithography and then annealing. The N-type base region 117a may be formed by ion implanting the N-type impurity, e.g., As or P, at a dose of about 1 $E13/cm^2$ to about $1.5\ E13/cm^2$ with an energy of about 35 KeV to about 40 KeV.

Referring to FIG. 5, a first polycrystalline silicon layer 119 is formed on the entire surface of the silicon substrate 101 having the P-type base region 117a and the N-type base region 117b. Then, a first photoresist pattern 121 that partially exposes regions above upper portions of the P-type base region 117a and the N-type base region 117b is formed on the first polycrystalline silicon layer 119. Exposed regions in the first photoresist pattern 121 define emitter regions.

Referring to FIG. 6, the first polycrystalline silicon layer 119 is etched using the first photoresist pattern 121 as an etch mask. Thus, a first polycrystalline silicon layer pattern 119a that has contact holes 118 partially exposing surfaces of the P-type base region 117a and the N-type base region 117b is formed. The contact holes 118 will become the emitter regions of the NPN bipolar junction transistor and the PNP bipolar junction transistor. Then, the first photoresist pattern 121 is removed.

Referring to FIG. 7, a second polycrystalline silicon layer 120 is formed on the entire surface of the silicon substrate 101 having the first polycrystalline silicon layer pattern 119a thereon. The second polycrystalline silicon layer 120 also fills the contact holes 118 of the NPN bipolar junction transistor region and the PNP bipolar junction transistor region.

Referring to FIG. 8, a second photoresist pattern 123 that covers the NPN bipolar junction transistor region and exposes the PNP bipolar junction transistor region is formed on the second polycrystalline silicon layer 120.

Subsequently, the P-type impurity is implanted into the second polycrystalline silicon layer 120 of the PNP bipolar junction transistor region using the second photoresist pattern 123 as a mask. The second polycrystalline silicon layer 120 of the PNP bipolar junction transistor region may be implanted with the P-type impurity e.g., B, at a dose of about $5\ E15/cm^2$ to about $1\ E16/cm^2$, and preferably about $1\ E16/cm^2$, with an energy of about 40 KeV to about 80 KeV.

Figure 9:
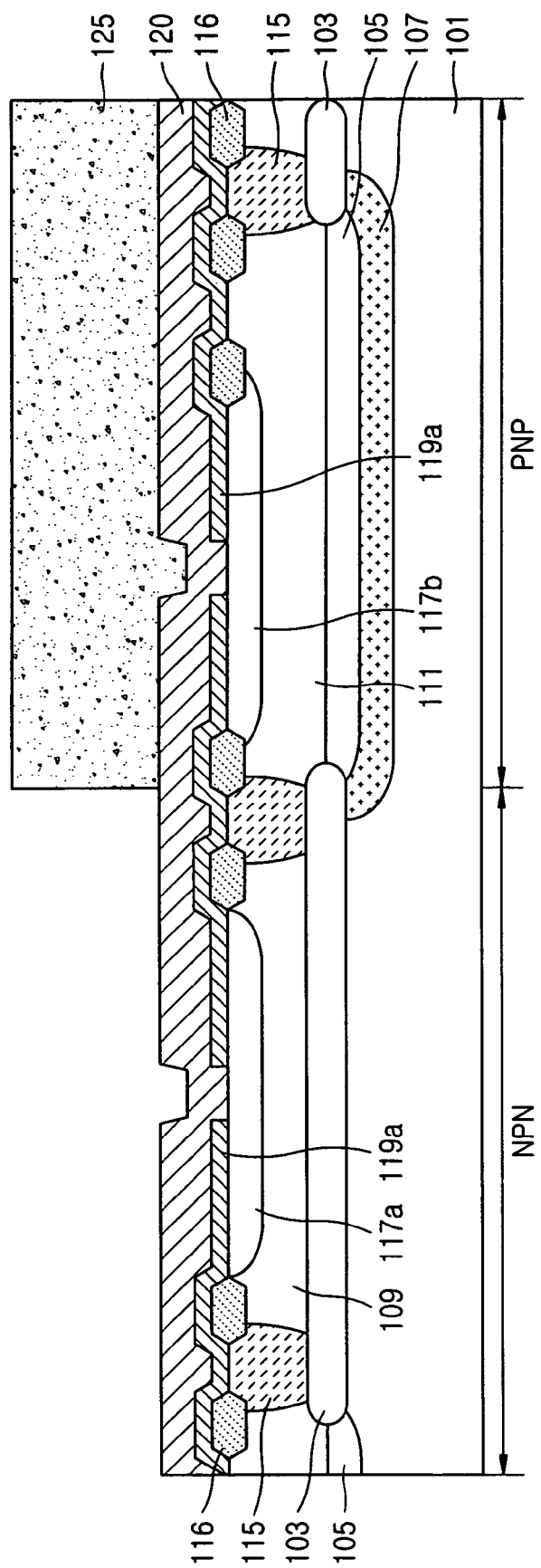

Referring to FIG. 9, the second photoresist pattern 123 is removed. Then, a third photoresist pattern 125 is provided on the second polycrystalline silicon layer 120, which covers the PNP bipolar junction transistor region and exposes the NPN bipolar junction transistor region.

Thereafter, the N-type impurity is implanted into the second polycrystalline silicon layer 120 of the NPN bipolar junction transistor region using the third photoresist pattern 125 as a mask. The second polycrystalline silicon layer 120 of the NPN bipolar junction transistor region may be implanted by the N-type impurity, e.g., As or P, at a dose of about $9\ E15/cm^2$ to about $1\ E16/cm^2$, and preferably about $1\ E16/cm^2$, with an energy of about 40 KeV to about 80 KeV.

Figure 10:
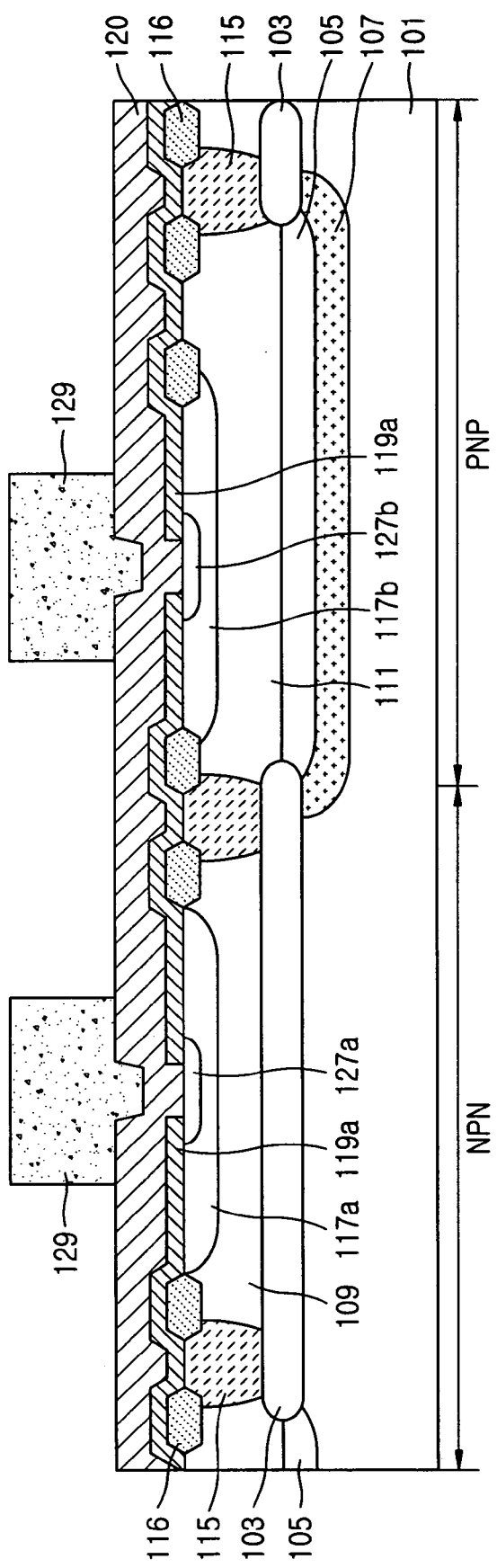

Referring to FIG. 10, the third photoresist pattern 125 is removed. Then, the N-type impurity and the P-type impurity belonging to the second polycrystalline silicon layer 120 are respectively diffused to the P-type base region 117a and the N-type base region 117b via annealing. The annealing of the N-type impurity and the P-type impurity may be performed at a temperature of about 900° C. to about 1100° C.

Thus, an N-type emitter region 127a of the NPN bipolar junction transistor region and a P-type emitter region 127b of the PNP bipolar junction transistor region are formed. A junction depth of the N-type emitter region 127a of the NPN bipolar junction transistor region and the P-type emitter region 127b of the PNP bipolar junction transistor region may be about 0.1 μm to about 0.2 μm.

In the above exemplary embodiment, the N-type and P-type impurities are respectively ion-implanted into the second polycrystalline silicon layer 120 of the NPN bipolar junction transistor region and the PNP bipolar junction transistor region. Then, the N-type emitter region 127a and the P-type emitter region 127b are formed by annealing. However, the N-type emitter region 127a may be formed by annealing after ion implanting the N-type impurity into the second polycrystalline silicon layer 120 of the NPN bipolar junction transistor region, and the P-type emitter region 127b may then be formed by annealing after ion implanting the P-type impurity into the second polycrystalline silicon layer 120 of the PNP bipolar junction transistor region.

The NPN bipolar junction transistor region is formed with the N-type emitter region 127a, the P-type base region 117a, and the N-type collector 115, thereby forming the NPN bipolar junction transistor. Also, the PNP bipolar junction transistor region is formed with the P-type emitter region 127b, the N-type base region 117b, and the P-type collector region 111, thereby forming a vertical PNP bipolar junction transistor.

Thereafter, a fourth photoresist pattern 129 is provided on the second polycrystalline silicon layer 120 disposed on upper portions of the N-type emitter region 127a of the NPN bipolar junction transistor region and the P-type emitter region 127b of the PNP bipolar junction transistor region.

Figure 11:
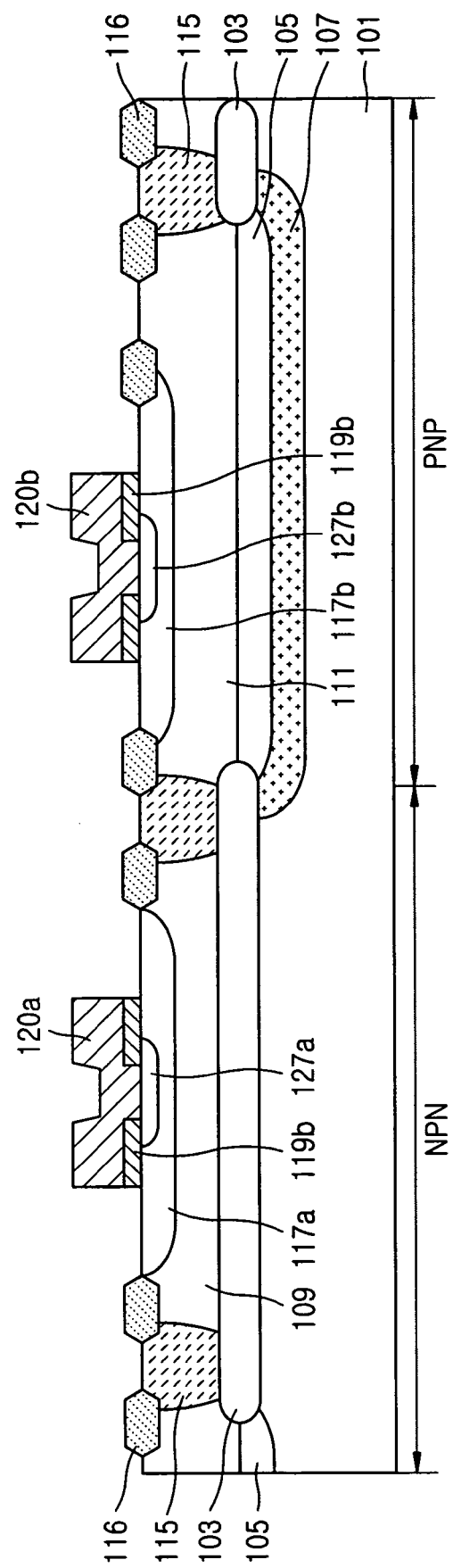

Referring to FIG. 11, the second polycrystalline silicon layer 120 and the first polycrystalline silicon layer pattern 119a are sequentially etched using the fourth photoresist pattern 129 as an etch mask, thereby simultaneously forming an N-type emitter electrode 120a and a P-type emitter electrode 120b. In other words, the NPN bipolar junction transistor region is formed with the N-type emitter electrode 120a, and the PNP bipolar junction transistor region is formed with the P-type emitter electrode 120b.

During etching the second polycrystalline silicon layer 120, the first polycrystalline silicon layer pattern 119a is simultaneously etched. Thus, a first polycrystalline silicon layer pattern denoted by a reference numeral 119b is formed. By etching the polycrystalline silicon layer pattern 119a, surfaces of the P-type base region 117a and the N-type collector region 115 of the NPN bipolar junction transistor region, and surfaces of the N-type base region 117b and the P-type collector region 111 of the PNP bipolar junction transistor region are exposed.

Then, the fourth photoresist pattern 129 is removed. Subsequently, an electrode (not shown) is formed on the P-type base region 117a and the N-type impurity region 115 of the NPN bipolar junction transistor region, and on the N-type base region 117b and the P-type well 111 (the P-type collector region) of the PNP bipolar junction transistor region by interposing an insulating layer (not shown). Therefore, a complimentary bipolar junction transistor is completed.

According to the present invention as described above, a polycrystalline silicon layer is used, so that an N-type emitter electrode of an NPN bipolar junction transistor and a P-type emitter electrode of a PNP bipolar junction transistor are not sequentially formed, but are simultaneously formed by a single depositing and etching process.

Furthermore, the P-type emitter region of the vertical PNP bipolar junction transistor is formed as a shallow junction, thereby providing a PNP bipolar junction transistor having high performance.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a complementary bipolar junction transistor, comprising:

respectively forming an N-type buried layer and a P-type buried layer on an NPN bipolar junction transistor region and a PNP bipolar junction transistor region of a silicon substrate;

forming an N-type epitaxial layer on an entire surface of the silicon substrate having the N-type buried layer and the P-type buried layer;

forming a P-type collector region in the N-type epitaxial layer of the PNP bipolar junction transistor region;

forming an N-type collector region, which is electrically connected to the N-type buried layer, on the N-type epitaxial layer of the NPN bipolar junction transistor region;

defining an active region by forming field regions of the N-type epitaxial layer, the N-type collector region and the P-type collector region;

respectively forming a P-type base region and an N-type base region on the active regions of the PNP bipolar junction transistor region and the NPN bipolar junction transistor region;

forming a first polycrystalline silicon layer pattern having contact holes that partially expose surfaces of the P-type base region and the N-type base region;

forming a second polycrystalline silicon layer on an entire surface of the silicon substrate having the first polycrystalline silicon layer pattern, the second polycrystalline silicon layer filling the contact holes;

respectively forming an N-type emitter region and a P-type emitter region within the P-type base region and the N-type base region by implanting and diffusing an N-type impurity and a P-type impurity respectively into the second polycrystalline silicon layer of the NPN bipolar junction transistor region and the PNP bipolar junction transistor region; and simultaneously forming an N-type emitter electrode and a P-type emitter electrode by patterning the second polycrystalline silicon layer and the first polycrystalline silicon layer.

2. The method of fabricating a complementary bipolar junction transistor as claimed in claim 1, further comprising forming an N-type vertical buried layer in a lower portion of the P-type buried layer of the PNP bipolar junction transistor region to encircle the P-type buried layer.

3. The method of fabricating a complementary bipolar junction transistor as claimed in claim 1, wherein the forming the first polycrystalline silicon layer pattern comprises:

forming a first polycrystalline silicon layer on an entire surface of the silicon substrate having the P-type base region and the N-type base region;

forming a photoresist pattern that partially exposes an upper portion of the first polycrystalline silicon layer disposed on upper portions of the P-type base region and the N-type base region; and etching the first polycrystalline silicon layer using the photoresist pattern as an etch mask.

4. The method of fabricating a complementary bipolar junction transistor as claimed in claim 1, wherein a junction depth of the N-type emitter region of the NPN bipolar junction transistor region and the P-type emitter region of the PNP bipolar junction transistor region is about 0.1 $\mu$m to about 0.2 $\mu$m.

5. The method of fabricating a complementary bipolar junction transistor as claimed in claim 1, wherein, while etching the second polycrystalline silicon layer, the first polycrystalline silicon layer pattern is simultaneously etched, thereby exposing surfaces of each of the P-type base region, the N-type collector region, the N-type base region, and the P-type collector region.

6. The method of fabricating a complementary bipolar junction transistor as claimed in claim 1, wherein the second polycrystalline silicon layer of the PNP bipolar junction transistor region is implanted by implanting boron (B) at a dose of about 5 E15/cm$^2$ to about 1 E16/cm$^2$ with an energy of about 40 KeV to about 80 KeV.

7. The method of fabricating a complementary bipolar junction transistor as claimed in claim 1, wherein the second polycrystalline silicon layer of the NPN bipolar junction transistor region is implanted by implanting one of arsenic (As) and phosphor (P) at a dose of about 9 E15/cm$^2$ to about 1 E16/cm$^2$ with an energy of about 40 KeV to 80 KeV.

8. The method of fabricating a complementary bipolar junction transistor as claimed in claim 1, wherein forming the N-type emitter region and the P-type emitter region comprises:

implanting an N-type impurity and a P-type impurity respectively into the second polycrystalline silicon layer of the NPN bipolar junction transistor region and the PNP bipolar junction transistor region; and simultaneously forming the N-type emitter region and the P-type emitter region using annealing to diffuse the N-type impurity and the P-type impurity included in the second polycrystalline silicon layer into the silicon substrate through the contact holes.

9. The method of fabricating a complementary bipolar junction transistor as claimed in claim 8, wherein the annealing the N-type impurity and the P-type impurity is performed at a temperature of about 900° C. to about 1100° C.

10. A method of fabricating a complementary bipolar junction transistor, comprising:

providing a substrate having a P-type base region and an N-type base region on active regions of a PNP bipolar junction transistor region and an NPN bipolar junction transistor region;

forming a first polycrystalline silicon layer pattern having contact holes that partially expose surfaces of the P-type base region and the N-type base region;

forming a second polycrystalline silicon layer on an entire surface of the silicon substrate having the first polycrystalline silicon layer pattern, the second polycrystalline silicon layer filling the contact holes;

respectively forming an N-type emitter region and a P-type emitter region within the P-type base region and the N-type base region by implanting and diffusing an N-type impurity and a P-type impurity respectively into the second polycrystalline silicon layer of the NPN bipolar junction transistor region and the PNP bipolar junction transistor region; and simultaneously forming an N-type emitter electrode and a P-type emitter electrode by patterning the second polycrystalline silicon layer and the first polycrystalline silicon layer.

* * * * *